United States Patent
deVilliers

(10) Patent No.: US 9,620,383 B2
(45) Date of Patent: Apr. 11, 2017

(54) METHOD FOR UNCOVERING UNDERLYING ALIGNMENT PATTERNS

(71) Applicant: Tokyo Electron Limited, Minato-ku, Tokyo (JP)

(72) Inventor: Anton J. deVilliers, Clifton Park, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/795,478

(22) Filed: Jul. 9, 2015

(65) Prior Publication Data

US 2016/0013069 A1  Jan. 14, 2016

Related U.S. Application Data

(60) Provisional application No. 62/022,790, filed on Jul. 10, 2014.

(51) Int. Cl.
  *H01L 21/31* (2006.01)
  *H01L 21/311* (2006.01)
  *H01L 23/544* (2006.01)

(52) U.S. Cl.
  CPC ...... *H01L 21/31133* (2013.01); *H01L 23/544* (2013.01); *H01L 2223/5446* (2013.01); *H01L 2223/54426* (2013.01); *H01L 2924/0002* (2013.01)

(58) Field of Classification Search
  CPC .................................................. H01L 21/31133
  See application file for complete search history.

(56) References Cited

U.S. PATENT DOCUMENTS

| | | | | |
|---|---|---|---|---|
| 2002/0115025 A1* | 8/2002 | Noda | ........................ | G03F 7/42 430/329 |
| 2004/0241594 A1* | 12/2004 | Cheng | ................... | G03F 7/0007 430/328 |
| 2005/0035983 A1* | 2/2005 | Cruchon-Dupeyrat | | B82Y 10/00 346/140.1 |
| 2005/0161836 A1* | 7/2005 | Yudasaka | .............. | H01L 23/544 257/797 |
| 2011/0147984 A1* | 6/2011 | Cheng | ................... | B82Y 10/00 264/220 |

\* cited by examiner

*Primary Examiner* — Duy Deo
*Assistant Examiner* — Mahmoud Dahimene

(57) ABSTRACT

Techniques disclosed herein include methods and systems for clearing out films or materials that may be covering alignment marks on substrates such as semiconductor wafers. Such films include photoresist layers, polymer films, thin films, and other layers that may be opaque or semi-opaque to optical alignment systems. A solvent composition is printed directly on resist films or other patterning films at specified points or regions on a substrate. The solvent composition printed or deposited on a resist film then begins to dissolve portions of the resist film that are directly underneath the solvent composition. The solvent composition and dissolved film material is then removed or washed from the substrate without causing other portions of the resist film to be dissolved, thereby uncovering alignment patterns or marks.

18 Claims, 4 Drawing Sheets

METHOD FOR UNCOVERING UNDERLYING ALIGNMENT PATTERNS

CROSS REFERENCE TO RELATED APPLICATIONS

The present application claims the benefit of U.S. Provisional Patent Application No. 62/022,790, filed on Jul. 10, 2014, entitled "Method for Uncovering Underlying Alignment Patterns," which is incorporated herein by reference in its entirety.

BACKGROUND OF THE INVENTION

Techniques disclosed herein relate to semiconductor device fabrication.

Modern semiconductor devices such as, for example, integrated circuit (IC) devices or chips, may be manufactured by processing a semiconductor carrier such as a wafer. Integrated circuits may include a plurality of layers, e.g. one or more semiconducting, insulating, and/or conducting layers, which may be stacked one over the other. Having accurate overlay (alignment) of an upper layer to a lower layer is beneficial to device performance. Alignment marks have been used for alignment, for example, when aligning lithographically defined layers by means of a stepper or scanner.

Scribe lane alignment marks are typically used in the fabrication of integrated circuitry to precisely align the substrates with respect to reticles which are used to pattern the substrates. Typically at least two of such marks are placed within a scribe lane area of a substrate, often between integrated circuit die areas. Scribe lanes are also known as scribe lines. Alignment marks can include a plurality of raised and/or lowered or buried features for which a stepper/scanner can optically search to determine and/or modify x-y alignment of the substrate for subsequent processing. Individual spaced features within an alignment mark can be spaced rectangles, although any configuration can be used.

SUMMARY

As part of the semiconductor device fabrication process, alignment marks typically become covered, such as with a resist film (photoresist) or other thin films that are opaque or at least partially opaque to a scanner/stepper. For subsequent alignment of reticles with a substrate, the alignment marks need to be uncovered by clearing out film or resist portions that happen to be covering the alignment marks. Conventional techniques for clearing out resist areas covering alignment marks include using a photo layer. That is, a layer of radiation sensitive material is deposited on a wafer, the wafer is then exposed to light through a photomask in a stepper/scanner machine, and then the substrate is developed to remove the exposed (or unexposed) portions of a particular radiation-sensitive material. In other words, conventionally a photo scanner layer is used for clearing out alignment marks. In a given fabrication scheme, anywhere from 5-30% of photo layers can be used just to uncover alignment marks. Fabricating layers using such exposure tools can be expensive and time consuming.

Techniques disclosed herein include methods and systems for clearing out films or materials that may be covering alignment marks on a given substrate. Substrates can include semiconductor wafers, flat panel displays, photovoltaic panels, and so forth. Such films commonly include photoresist, polymer films, thin films, and other layers that are generally opaque to optical alignment systems. During fabrication of semiconductor devices, such as transistors, multiple fabrication techniques may be implemented. One common fabrication technique involves exposing a radiation-sensitive film to a pattern of light such as by using a scanner/stepper tool. As part of the light exposure process, a given scanner aligns itself with one or more underlying layers or dies. Radiation-sensitive films or other intermediate films can be opaque and thus underlying alignment marks are not visible to a scanner tool. Conventionally, a full, separate photolithographic exposure and development step is executed just to uncover alignment marks so that logic and memory patterning exposures can be accurately executed. Techniques herein, however, can be used to uncover alignment marks without using a photomask and associated exposure tools.

One example embodiment is a method for uncovering alignment marks, that is, removing material covering alignment marks. This method can include receiving a substrate having one or more alignment marks that are visibly covered by an overlying layer. This overlying layer is soluble to a predetermined solvent. The substrate is positioned on a substrate holder of printing system. Planar locations on the substrate are identified that have alignment marks covered by the overlying film. A solvent composition is deposited on the overlying layer at the identified planar locations using the printing system. A solvent composition includes the predetermined solvent. The printing system is configured to deposit solvent compositions based on a print pattern. Portions of the overlying layer that have been dissolved by the predetermined solvent then removed, thereby clearing out selected portions of the overlying layer so that alignment marks are visible.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein include methods and systems for clearing out films or materials that may be covering alignment marks on a given substrate. Substrates can include semiconductor wafers, flat panel displays, photovoltaic panels, and so forth. Such films commonly include photoresist, polymer films, thin films, and other layers that are generally opaque or semi-opaque to optical alignment systems. During fabrication of semiconductor devices, such as transistors, multiple fabrication techniques may be implemented. One common fabrication technique involves exposing a radiation-sensitive film to a pattern of light such as by using a scanner/stepper tool. As part of the light exposure process a given scanner aligns itself with one or more underlying layers or dies. Typically, however, radiation-sensitive films are opaque and thus underlying alignment marks are not visible to a scanner tool. Conventionally, a full photolithographic exposure and development step (separate step) is executed just to uncover alignment marks so that patterning exposures can be accurately aligned and executed. For example, prior to exposing a resist to an etch pattern, the resist may first need to be exposed to a reticle pattern only used to protect/deprotect alignment mark areas so that these areas can be developed to reveal the alignment marks. After which, the resist can be exposed to a reticle mask pattern and then developed.

Techniques disclosed herein include methods for clearing out films covering alignment marks without requiring a photomask-based exposure step. This means that films— including resist films—can be cleared out to uncover alignment marks without requiring a scanner/stepper or other photolithographic exposure tool. Accordingly, methods herein can provide a more economical method for uncovering alignment marks and/or provide a method that can be executed on coater/developer tools.

Techniques herein include printing solvent compositions directly on resist films and other patterning films at planar (X-Y) locations. The solvent composition printed or deposited on a resist film then begins to dissolve portions of the resist film (or films) that are directly underneath the solvent composition. With a given substrate positioned on a generally horizontal surface, gravity can assist with the dissolution of the resist film as each spot of solvent composition deposited on the resist film sinks into the resist film as it quickly or slowly dissolves the resist film. After the solvent composition has dissolved underlying resist films at specific, deposited locations, the solvent composition can then be removed or washed from the substrate without causing other portions of the resist film to be dissolved. Accordingly, resist films or opaque films can be quickly and economically removed from alignment marks in one or more underlying layers.

Figure 1:
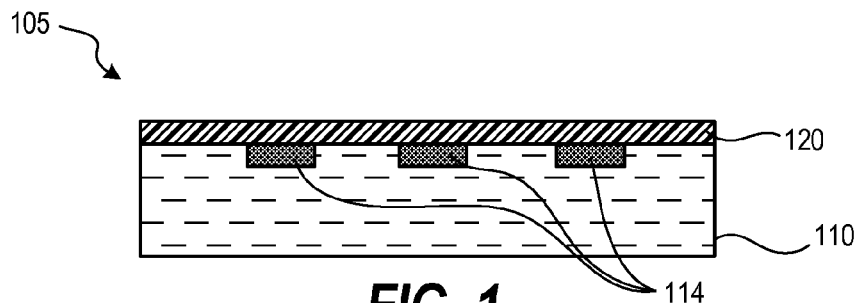
FIG. 1 is a cross-sectional schematic view of an example substrate segment showing alignment marks according to embodiments disclosed herein.

One example embodiment can be explained with reference to the accompanying figures. Example embodiments include a method for uncovering alignment marks. A substrate is received that has one or more alignment marks that are visibly covered by an overlying layer. The overlying layer is soluble to a predetermined solvent. The predetermined solvent can include multiple different solvents depending on material properties of the overlying layer. FIG. 1 shows an example substrate 105 that includes multiple alignment marks 114 that are shown positioned within underlying layer 110. Note that for convenience in understanding methods herein alignment marks 114 are shown at the top portion the underlying layer 110. In practice, however, alignment marks 114 can be located within underlying layer 110, especially if underlying layer 110 is transparent. Note also that one or more layers can comprise underlying layer 110. Overlying layer 120 is shown covering alignment marks 114. In most embodiments the overlying layer 120 includes a photoresist material, radiation-sensitive material, or other patterning material that is deposited in preparation for a subsequent patterning exposure step. Overlying layer 120 can include multiple distinct layers. Overlying layer 120 is opaque, semi-opaque, or otherwise impedes viewing or reading of alignment marks. Alignment marks 114 can be in any shape or pattern and function to indicate location of existing features or location of features to be fabricated. One common example of such alignment marks includes indicia within scribe lanes between dies of a given wafer. In another example, alignment marks can be a series or pattern of lines.

The substrate is then positioned on a substrate holder of a printing system. The substrate holder and/or printing system can be a stand-alone tool, or can be a module of a larger tool such as part of a coater/developer tool. As part of a coater/developer tool, a resist film can be deposited on a wafer, baked, have alignment marks cleared out, and then be transferred to a scanner/stepper ready for patterning a mask.

In one step, planar locations on the substrate having alignment marks 114 covered by the overlying layer 120 are identified. In other words, X-Y locations of the alignment marks 114 are identified such as by retrieving a map of alignment mark locations. This map can be stored in memory of a corresponding system and/or retrieved from a separate system, fed forward, etc. Note that although overlying layer 120 may be covering an entire substrate, identifying locations to clear out to reveal alignment marks is possible based on a shape of a wafer, separate or edge alignment marks, and based on relative tolerances. Alignment mark clear outs can have a tolerance that is several orders of magnitude greater than alignment tolerances for fabricating semiconductor devices and structures. For example, alignment marks can be dimensioned on a micron scale while devices are dimensioned on a nanometer scale.

A solvent composition 130 is then deposited on overlying layer 120 at the identified planar locations using printing system 150. The solvent composition includes the predetermined solvent (selected as a substance that will dissolve material used for overlying layer 120). In some embodiments the solvent composition may contain nothing more than the solvent itself, while in other embodiments the solvent composition can include a solvent itself along with one or more materials to assist with printing considerations and/or regulate solvent action. For example, additional materials can include thickeners, anticoagulation agents, and other conditioners that can assist with chemical or mechanical aspects of flow to a corresponding print head and printing/depositing solvent onto a substrate surface.

The printing system 150 is configured to deposit solvent compositions based on a given print pattern. Printing system 150 can be embodied using any conventional micro printing system. For example, laser-based printers, ink jet printers, bubble jet printers, and other printing technologies can be used that permit printing (direct, pinpointed deposition) of solvents or solvent compositions on a substrate. Solvent compositions can then be printed directly on a surface of a wafer at very small scales. For example, current micro printing systems can print ink and other compositions on a micron scale. For example, micro printing systems can print dots on the order of 10 microns in horizontal diameter, which is a smaller resolution than typical clear out areas needed for conventional alignment marks sizes.

By way of a non-limiting embodiment, a given clear out size can have a dimension of about 50 microns×100 microns. If a given print head can print a spot size diameter of 10 microns, then an array of 5×10 deposition spots of solvent composition can be deposited or printed on the substrate (on the overlying layer 120), at locations above alignment marks 114.

Figure 2:
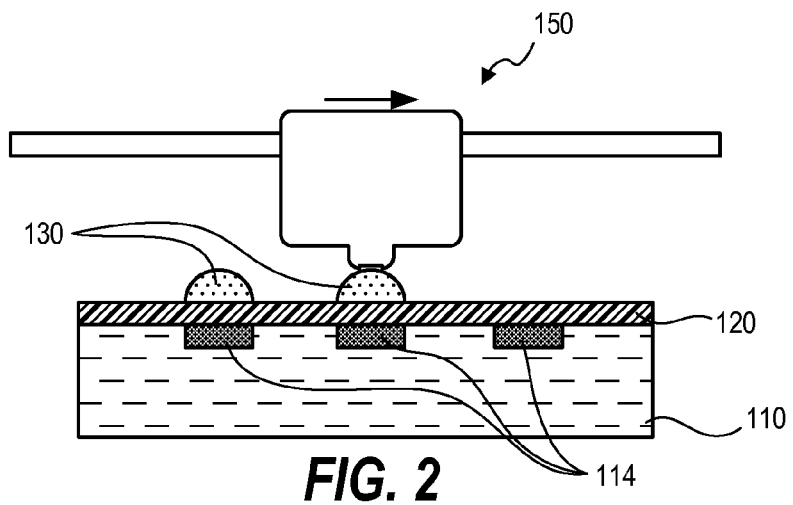
FIG. 2 is a cross-sectional schematic view of an example substrate segment with printing system according to embodiments disclosed herein.

FIG. 2 is an example schematic showing the printing system 150 moving across the substrate 105 and printing dots (depositing solvent composition) on the overlying layer 120 at locations directly above alignment marks 114. Note that if overlying layer 120 is not already hydrophobic, then solvent composition 130 can be tuned accordingly to prevent dispersion across overlying layer 120. When overlying layer 120 is embodied as a photoresist film, a given photoresist selected may already have hydrophobic properties to enable use with immersion style scanners or immersion-based lithography systems. In other words, overlying layer 120 may already have material properties that cause liquids to bead-up on the surface and remain at deposited locations. If not, then a surface treatment can be executed prior to deposition, or a solvent composition can be formulated to essentially remain where deposited without spreading out across overlying layer 120.

Figure 3:
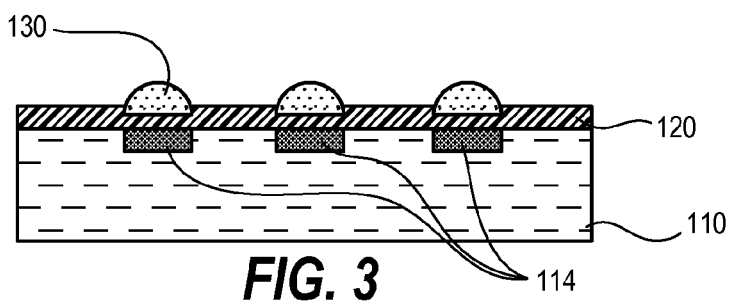
FIG. 3 is a cross-sectional schematic view of an example substrate segment with printed solvent according to embodiments disclosed herein.
Figure 4:
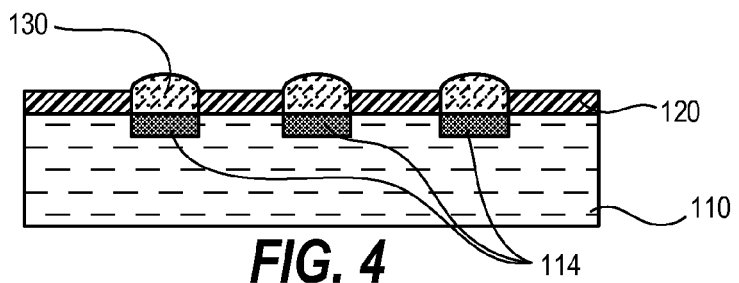
FIG. 4 is a cross-sectional schematic view of an example substrate segment with printed solvent according to embodiments disclosed herein.

Referring now to FIG. 3, after a solvent composition has been printed according to a given print pattern, the solvent within the solvent composition begins dissolving the overlying layer 120 at locations directly beneath the solvent composition. Note that the example diagrams are not necessarily to scale. For example, some resist films may have a thickness on the order of 100 nm. Depending on a particular solvent composition been deposited, the solvent composition may have a deposited height of 1000 to 10,000 nm. Thus, in many embodiments the deposited solvent composition thickness is substantially greater than a thickness of the overlying layer 120. If the solvent concentration within the solvent composition is relatively high, then dissolution of the overlying layer 120 will be relatively quick. Likewise, if the solvent concentration within the solvent composition is relatively low, then dissolution of the overlying layer 120 will be comparatively slow. FIG. 4 shows results after solvent composition 130 has completed dissolved portions of the overlying layer 120 that are directly beneath deposited areas of solvent composition 130.

In various embodiments concentration of the solvent can be adjusted to enable removal of solvents on printed areas without damaging remaining areas of resist. For example, a relatively high concentration of solvent can quickly dissolve any areas of photoresist that the solvent contacts. Lowering a concentration of solvent in the solvent composition results in a solvent composition that takes longer to dissolve a given thickness of resist. For example instead of dissolving a resist in less than one second, a given solvent composition can be formulated to dissolve resist in, by way of a non-limiting example, 10 seconds. After completing such a time-based dissolution of the resist, the entire wafer or areas of clear out can then be flooded with deionized water or other rinsing/cleaning fluid which can clear off the wafer a fraction of a second. Although a portion of the solvent solution printed on the wafer may come in contact with other portions of the resist, this contact duration, in combination with further dilution from the deionized water, is insufficient to substantially dissolve any portions of the remaining resist.

Figure 5:
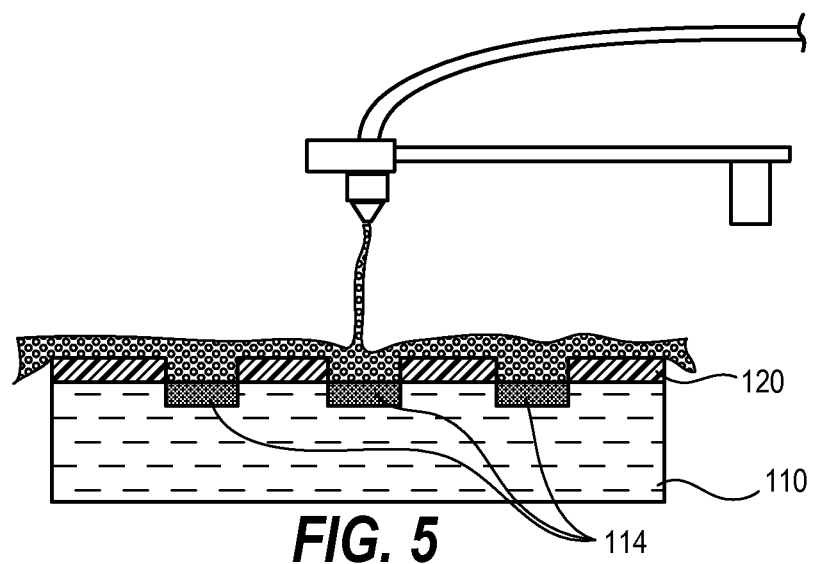
FIG. 5 is a cross-sectional schematic view of an example substrate segment with rinse system according to embodiments disclosed herein
Figure 6:
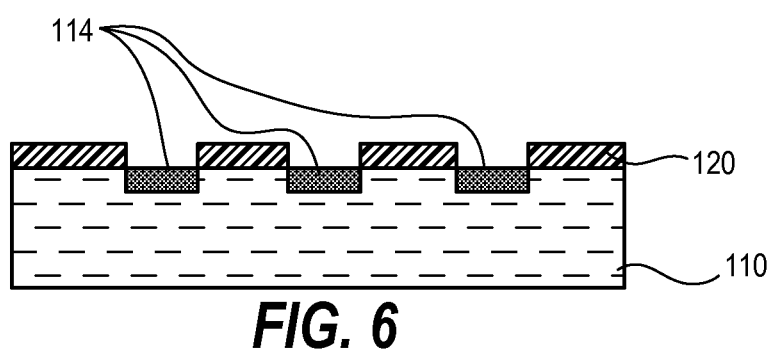
FIG. 6 is a cross-sectional schematic view of an example substrate segment showing uncovered alignment marks according to embodiments disclosed herein.
Figure 7:
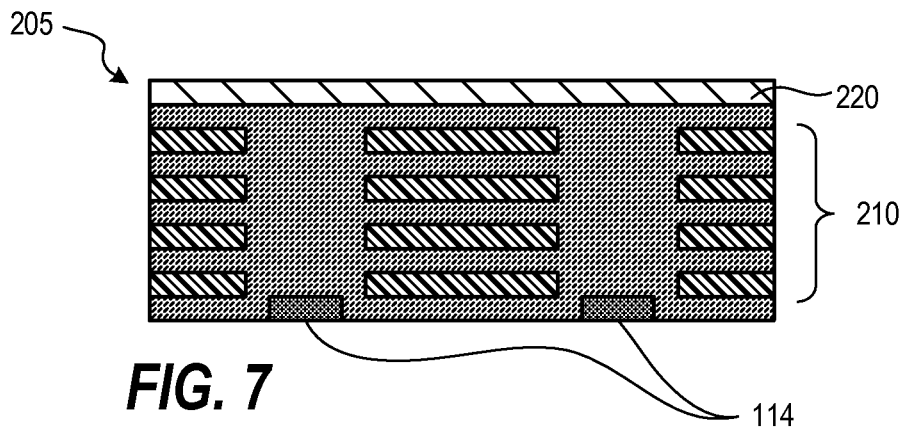
FIG. 7 is a cross-sectional schematic view of an example substrate segment showing alignment marks according to embodiments disclosed herein.

A given solvent composition can be tuned to dissolve a given film in various time durations based on a given project objective. Thus, by using concentration tuning, a given solvent can be printed on the wafer to enable areas to be cleared out without damaging remaining areas of resist on the wafer. FIG. 5 illustrates one example rinsing technique. In one embodiment, dissolved portions of the overlying layer 120 and solvent composition 130 are rinsed off of the substrate by spinning substrates under a jet or flow of cleansing fluid. An example result of such cleaning operation is shown in FIG. 6. Note that alignment marks 114 are now visible from above (uncovered) and that portions of the overlying layer 120 have been cleared out.

FIGS. 7-12 illustrate another example embodiment. In the example in FIGS. 1-6, the overlying layer, such as a photoresist, prevented alignment marks from being visible. It is common, however, for resist films to be relatively transparent with underlying layers or intermediate layers being opaque. Accordingly, in FIG. 7, a substrate 205 is received that has one or more alignment marks 114 that are visibly covered by an intermediate layer 210. Note that intermediate layer 210 can include multiple individual layers and repeating layers. The intermediate layer 210 is at least partially opaque. By way of a non-limiting example, such intermediate layers can be part of a NAND memory device. Thus, in some embodiments, the substrate can include semiconductor structures that have been at least partially fabricated. The substrate 205 also includes a patterning layer 220 (such as a photoresist film) positioned on the intermediate layer. The patterning layer can be soluble to a predetermined solvent, of which there are many options conventionally available. As is observable from FIG. 7, alignment marks 114 can be essentially buried beneath multiple layers. Such alignment marks 114 can be located within scribe lanes on a wafer. This means that approximate location can be identified from a top view, though uncovering overlying materials is necessary for accurate alignment for subsequent fabrication processes.

Substrate 205 is positioned on a substrate holder of a printing system 150. Note that this printing system can be a module within a coater/developer tool, or a standalone tool, or merely a substrate holder that is accessible to a print head. Next, planar locations on that substrate that have alignment marks covered by the intermediate layer(s) and patterning layer(s) are identified. Such identification can be executed using various pre-alignment techniques. For example, techniques including optical pre-alignment, mechanical alignment, and spot sensor alignment can be used. Note that these alignment techniques are conventionally known. These techniques can use various mechanisms such as identifying notches on a wafer, spinning a wafer and taking laser-based spot readings, and optical identification of scribe lane artifacts.

Figure 8:
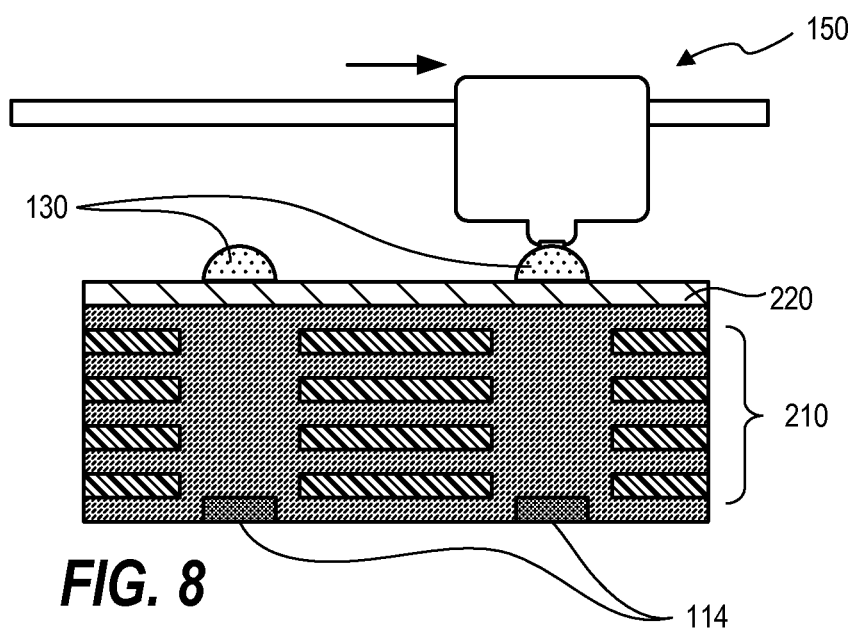
FIG. 8 is a cross-sectional schematic view of an example substrate segment with printing system according to embodiments disclosed herein.

Next, as shown in FIG. 8, a solvent composition 130 is deposited on the patterning layer at the identified planar locations using the printing system 150. The solvent composition 130 includes the predetermined solvent, that is, a particular solvent capable of dissolving material in the patterning layer 220. The printing system 150 is configured to deposit solvent compositions on substrates, as described above. In other words, solvent can be deposited on the substrate via a printing mechanism at various substrate surface locations and in various patterns. These locations can be above alignment marks or other locations to be uncovered to make underlying features visible or accessible.

Figure 9:
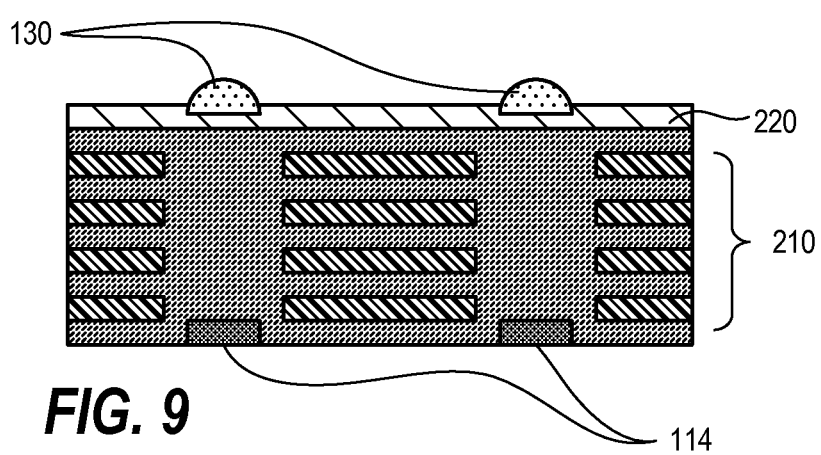
FIG. 9 is a cross-sectional schematic view of an example substrate segment with printed solvent according to embodiments disclosed herein.
Figure 10:
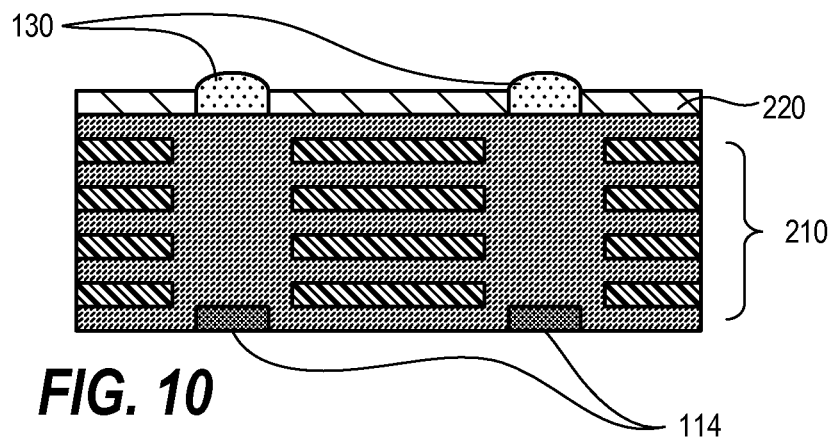
FIG. 10 is a cross-sectional schematic view of an example substrate segment with printed solvent according to embodiments disclosed herein.

FIG. 9 illustrates the solvent composition 130 dissolving material from patterning layer 220 directly underneath the bubble of solvent (which can benefit from action of gravity in typical substrate orientations). FIG. 10 shows that the solvent composition 130 has completely dissolved underlying portions of patterning layer 220 down to intermediate layer 210. In some embodiments, depositing the solvent composition can include depositing a predetermined concentration of the predetermined solvent. The predetermined solvent dissolves the photoresist film at print locations, that is, locations in which solvent has been deposited on the substrate surface. Various conventional solvents are more or less effective at dissolving a given resist formulation. Accordingly, the predetermined solvent can be selected as compatible for dissolving a given selected photoresist formulation. The predetermined concentration can be selected to require a predetermined contact time to dissolve the patterning layer based on a given thickness of the patterning layer. For example, in some embodiments, depending on fabrication goals, solvent compositions can be selected that dissolve patterning layers relatively quickly. In other embodiments, it may be desirable to slow or regulate the dissolving action so that a time duration necessary for dissolving the resist film lasts several seconds or more. Such a relative delay in dissolution can benefit subsequent cleaning steps and help prevent lateral dissolution. Various resist films are inherently hydrophobic, and this property can also help prevent lateral movement of solvent composition and dissolution in unwanted regions.

Figure 11:
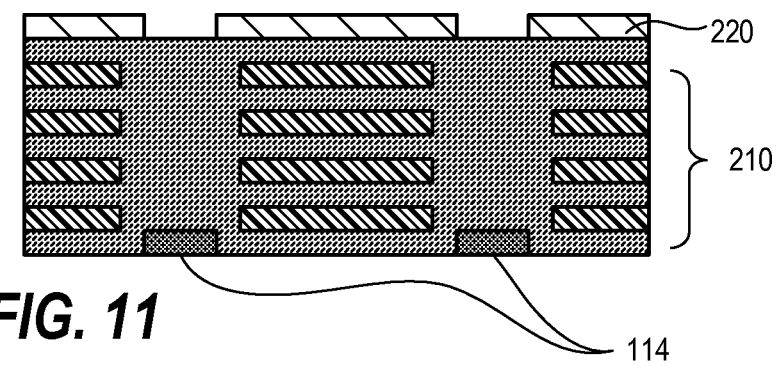
FIG. 11 is a cross-sectional schematic view of an example substrate segment after rinsing dissolved regions according to embodiments disclosed herein.

After dissolving portions of patterning layer 220, such portions are removed from the substrate. Various techniques can be used to clean the substrate, such as evaporation, changing substrate orientation, and/or liquid rinse. A liquid rinse can involve depositing a cleaning and/or rinsing liquid to dilute and remove the predetermined solvent. Liquid removal can be aided by gravity, liquid flow and direction, spinning the substrate, etc. In many rinse techniques, the solvent may briefly come in contact with the patterning layer. Dissolution of other portions of the patterning layer can be mitigated by fast rinse operations and/or having the solvent at a lower concentration so that dissolution of remaining portions of the patterning layer is essentially negligible. FIG. 11 shows a result of a cleaning step. Note that portions of the patterning layer 220 above alignment marks 114 are now removed.

Figure 12:
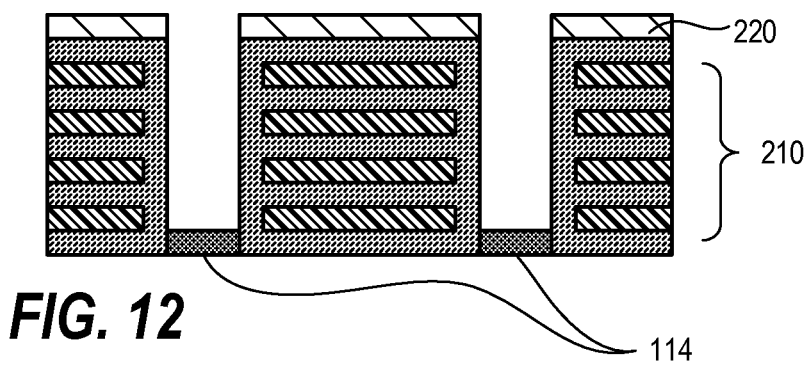
FIG. 12 is a cross-sectional schematic view of an example substrate segment showing uncovered alignment marks according to embodiments disclosed herein.

Next, an etch step can be executed that etches the intermediate layer using the patterning layer as an etch mask such that material from the intermediate layer above the alignment marks is removed and alignment marks are visible (uncovered) and/or accessible, such as for subsequent alignment operations, not limited to lithographic alignment of scanner and stepper tools. FIG. 12 shows a result of an etch step.

Other techniques can be used for cleaning dissolved portions and/or for arresting progress of the dissolving action. For example, in another embodiment, temperature control can be used for activating and/or deactivating a given solvent. For example, after printing a given solvent solution, a temperature of the solvent solution can be raised to activate a solvent and decreased to deactivate the solvent. Other solvent solutions can be thermally denatured to prevent dissolution of unintended areas of a resist film. Another technique for removing the solvent solution can include increasing temperature of the solvent solution to evaporate solvents.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for uncovering alignment marks, the method comprising:
   receiving a substrate having one or more alignment marks that are visibly covered by an overlying layer, the overlying layer being soluble to a predetermined solvent;
   positioning the substrate on a substrate holder of a printing system;
   identifying planar locations on the substrate having alignment marks covered by the overlying film;
   depositing a solvent composition on the overlying layer at the identified planar locations using the printing system, the solvent composition including the predetermined solvent, the printing system configured to deposit solvent compositions based on a print pattern, wherein depositing the solvent composition includes depositing a predetermined concentration of the predetermined solvent, wherein the predetermined concentration is selected to require a predetermined contact time to dissolve the overlying layer based on a given thickness of the overlying layer; and
   subsequent to depositing the solvent composition on the overlying layer at the identified planer locations using the printing system, removing portions of the overlying layer having been dissolved by the predetermined solvent including cleaning the substrate by executing a rinse step.

2. The method of claim 1, further comprising etching exposed portions of the underlying layer covering the one or more alignment marks.

3. The method of claim 1, wherein the overlying layer is a polymer film.

4. The method of claim 1, wherein the printing system is configured to deposit the solvent composition at a point resolution of less than 200 microns.

5. The method of claim 4, wherein the printing system is configured to deposit the solvent composition at a point resolution of less than 20 microns.

6. A method for uncovering alignment marks, the method comprising:
   receiving a substrate having one or more alignment marks that are visibly covered by an intermediate layer, the substrate having a patterning layer positioned on the intermediate layer, the patterning layer being soluble to a predetermined solvent;
   positioning the substrate on a substrate holder of a printing system;
   identifying planar locations on the substrate having alignment marks covered by the intermediate layer and the patterning layer;
   depositing a solvent composition on the patterning layer at the identified planar locations using the printing system, the solvent composition including the predetermined solvent, the printing system configured to deposit solvent compositions on substrates, wherein depositing the solvent composition includes depositing a predetermined concentration of the predetermined solvent, the predetermined solvent dissolves the photoresist film at print locations, wherein the predetermined concentration is selected to require a predetermined contact time to dissolve the patterning layer based on a given thickness of the patterning layer; and
   subsequent to depositing the solvent composition on the patterning layer at the identified planar locations using the printing system, removing portions of the patterning layer having been dissolved by the predetermined solvent including cleaning the substrate using a deionized water rinse step.

7. The method of claim 6, further comprising:
   executing an etch step that etches the intermediate layer using the patterning layer as an etch mask such that material from the intermediate layer above the alignment marks is removed and alignment marks are visible.

8. The method of claim 6, wherein identifying planar locations on the substrate having alignment marks covered by the overlying film includes executing an optical pre-alignment process.

9. The method of claim 6, wherein identifying planar locations on the substrate having alignment marks covered by the overlying film includes executing a mechanical alignment process.

10. The method of claim 6, wherein identifying planar locations on the substrate having alignment marks covered by the overlying film includes executing a spot sensor alignment process.

11. The method of claim 6, wherein the intermediate layer is at least partially opaque, and wherein the patterning layer is a polymer film deposited by spin coating.

12. The method of claim 6, wherein the patterning layer is a photoresist film.

13. The method of claim 6, wherein the printing system is configured to deposit the solvent composition at a point resolution of less than 200 microns.

14. The method of claim 6, wherein the printing system is configured to deposit the solvent composition at a point resolution of less than 20 microns.

15. The method of claim 6, wherein removing portions of the overlying layer having been dissolved includes removing the solvent composition from the substrate in less than approximately one second.

16. The method of claim 6, wherein removing portions of the overlying layer having been dissolved includes removing the solvent composition from the substrate in less than a contact time required to dissolve a given thickness of the patterning layer.

17. The method of claim 6, wherein the substrate includes semiconductor structures that have been at least partially fabricated.

18. The method of claim 15, wherein the printing system includes an inkjet printer configured to propel droplets of the predetermined solvent onto the substrate.

* * * * *